United States Patent

Muto et al.

[11] Patent Number: 5,874,864
[45] Date of Patent: Feb. 23, 1999

[54] CRYSTAL OSCILLATING DEVICE AND METHOD OF ADJUSTING SAID CRYSTAL OSCILLATING DEVICE

[75] Inventors: Masaki Muto, Katano; Yoshihisa Mochida, Ikoma; Ryuji Mizukoshi, Tokyo; Chikao Maeda, Kunitachi, all of Japan

[73] Assignee: Matsushita Electric Industrial Co., Ltd., Osaka, Japan

[21] Appl. No.: 964,678

[22] Filed: Nov. 5, 1997

[30] Foreign Application Priority Data

Nov. 6, 1996 [JP] Japan ..................................... 8-293513

[51] Int. Cl.⁶ ................................. H03B 5/04; H03B 5/36
[52] U.S. Cl. ..................... 331/66; 331/68; 331/108 D; 331/116 FE; 331/158; 331/176; 331/179; 331/177 V
[58] Field of Search ........................ 331/66, 68, 108 D, 331/116 R, 116 FE, 158, 176, 177 R, 179, 177 V; 310/315, 318

[56] References Cited

U.S. PATENT DOCUMENTS

5,668,506  9/1997  Watanabe et al. ..................... 331/66

*Primary Examiner*—Daivd Mis
*Attorney, Agent, or Firm*—Pearne, Gordon, McCoy & Granger LLP

[57] ABSTRACT

A control circuit includes: a temperature 30; a temperature sensing section 32; a memory 36, an amplifying section 31 to which the memory and the temperature sensor are electrically connected; a first D/A converting section 38 electrically interposed between the memory and the temperature sensing section; a second D/A converting section electrically interposed between the memory and the amplifying section 31, The amplifying section 31 includes: a polarity inverting circuit 33 connected to the temperature sensor; and a variable attenuator 34, an offset adjusting circuit 100, and an amplifying circuit 35 that are connected sequentially to the polarity inverting circuit. The amplifying section 31 is connected to a sample hold circuit 41 through a displacement buffering means 101. The memory has 8 or less working control voltage setting groups.

22 Claims, 11 Drawing Sheets

| |
|---|
| GRADIENT NO.1 TEMP. DETECTION DATA |
| GRADIENT NO.1 GRADIENT SETTING DATA |
| GRADIENT NO.1 GRADIENT SETTING DATA |
| GRADIENT NO.1 OFFSET VOLTAGE DATA |
| GRADIENT NO.2 TEMP. DETECTION DATA |
| GRADIENT NO.2 GRADIENT SETTING DATA |
| GRADIENT NO.2 GRADIENT SETTING DATA |
| GRADIENT NO.2 OFFSET VOLTAGE DATA |
| ⋮ |
| GRADIENT NO.8 TEMP. DETECTION DATA |
| GRADIENT NO.8 GRADIENT SETTING DATA |
| GRADIENT NO.8 GRADIENT SETTING DATA |
| GRADIENT NO.8 OFFSET VOLTAGE DATA |

CRYSTAL OSCILLATING DEVICE AND METHOD OF ADJUSTING SAID CRYSTAL OSCILLATING DEVICE

BACKGROUND OF THE INVENTION

1. Field of the Invention

The invention relates to a crystal oscillating device having a temperature compensation function and a method of adjusting such crystal oscillating device.

2. Description of the Related Art

A crystal oscillating device includes a crystal oscillator, and the oscillation frequency of the crystal oscillator greatly varies with varying temperatures.

In order to decrease the oscillation frequency variations of the crystal oscillator due to the aforementioned temperature variations, conventionally used is a technique for controlling the voltage to be applied to varactor diodes with a control circuit, the varactor diodes being used as frequency adjusting elements of the crystal oscillator.

An exemplary construction of such a conventional control circuit is characterized as follows. If such a circuit is designed to make temperature compensations for a temperature range of 130° C. from −35° to 95° C., temperature compensation data are stored in a memory in 4° C. increments by dividing such 130° C. temperature range into 4° C. segments.

In this case, the temperature compensation data in the aforementioned conventional example require data such as precise gradient, temperature bias point, polarity, rough gradient, and fixed offset in 4° C. increments. These data constitute a single control voltage setting group, and a total of 32 groups is stored in the memory.

That is, the conventional technique is characterized as selecting and outputting the data belonging to a single control voltage setting group within the memory based on the temperature detected by a temperature sensor. As a result, the oscillation frequency of the crystal oscillator can be stabilized independently of fluctuations in surrounding temperature.

What imposes problems in the aforementioned conventional example is that not only an increase in the size of the memory leads to an increase in the size of a semiconductor integrated circuit that is constructed of the memory and the control circuit, but also the control circuit itself becomes complicated and therefore disadvantageously consumes more power.

That is, in the aforementioned conventional example, the temperature compensation data are stored in the control voltage setting groups within the memory every 4° C. in order to make temperature compensations covering the temperature range from −35° to 95° C. in 4° C. increments. Therefore, the memory must have such a large capacity as to accommodate a total of 32 control voltage setting groups. In addition, in order to control such a large-capacity memory having a total of 32 control voltage setting groups, the control circuit therefor tends to be complicated and large-sized. As a result, the semiconductor integrated circuit that is constructed of the memory and the control circuit becomes disadvantageously large-sized.

Further, the control circuit that controls the memory having 32 control voltage setting groups has exhibited a tendency to consuming more power.

SUMMARY OF THE INVENTION

The invention has been made to solve the above problems, and therefore an object of the invention is to provide a crystal oscillating device with highly stable operation in which a semiconductor integrated circuit constructed of a memory and a control circuit is easy to downsize, power consumption is easy to decrease, and further an abrupt frequency change can be moderated at the time of changing gain setting data and offset voltage data in accordance with temperature variations.

To achieve the above purpose, the invention is applied to a crystal oscillating device that includes: a crystal oscillator; a frequency adjusting element electrically connected to the crystal oscillator; and a control circuit for controlling a voltage to be applied to the frequency adjusting element. The control circuit includes: a temperature sensor; a temperature sensing section electrically connected to the temperature sensor; a memory electrically connected to the temperature sensing section; an amplifying section to which the memory and the temperature sensor are electrically connected; a first D/A converting section electrically interposed between the memory and the temperature sensing section; and a second D/A converting section electrically interposed between the memory and the amplifying section. The amplifying section includes: a polarity inverting circuit connected to the temperature sensor; and a variable attenuator, an offset adjusting circuit, and an amplifying circuit connected sequentially to the polarity inverting circuit. The memory having a plurality of working control voltage setting groups, the plurality being 8 or less, each control voltage setting group having temperature detection data, gain setting data, and offset voltage data stored therein. The frequency adjusting element and the amplifying section interposing a sample hold circuit therebetween. The sample hold circuit and the amplifying section interposing a displacement buffering means therebetween. As a result of this construction, a crystal oscillating device can not only be downsized but also provide high stability of frequency.

In the invention, since the memory stores 8 or less working control voltage setting groups, each group consisting of temperature detection data, gain setting data, and offset voltage data, the capacity of the memory is small. In addition, the control circuit dedicated to such memory having 8 or less working control voltage setting groups is simply constructed, and therefore can be downsized easily. As a result of all these advantages, the semiconductor integrated circuit having the memory and the control circuit can be downsized more easily.

Further, using such small-capacity memory and simply constructed control circuit, the power consumed thereby can be decreased more easily. Still further, when gain setting data and offset voltage data have been changed, an abrupt change occurs in a control voltage. In such a case, the displacement buffering means gradually changes the voltage, so that high operation stability can be assured.

The above and other objects and features of the present invention will be more apparent from the following description taken in conjunction with the accompanying drawings.

DETAILED DESCRIPTION OF THE PREFERRED EMBODIMENTS

Now, a description will be given in more detail of preferred embodiments of the present invention with reference to the accompanying drawings.

Figure 2:
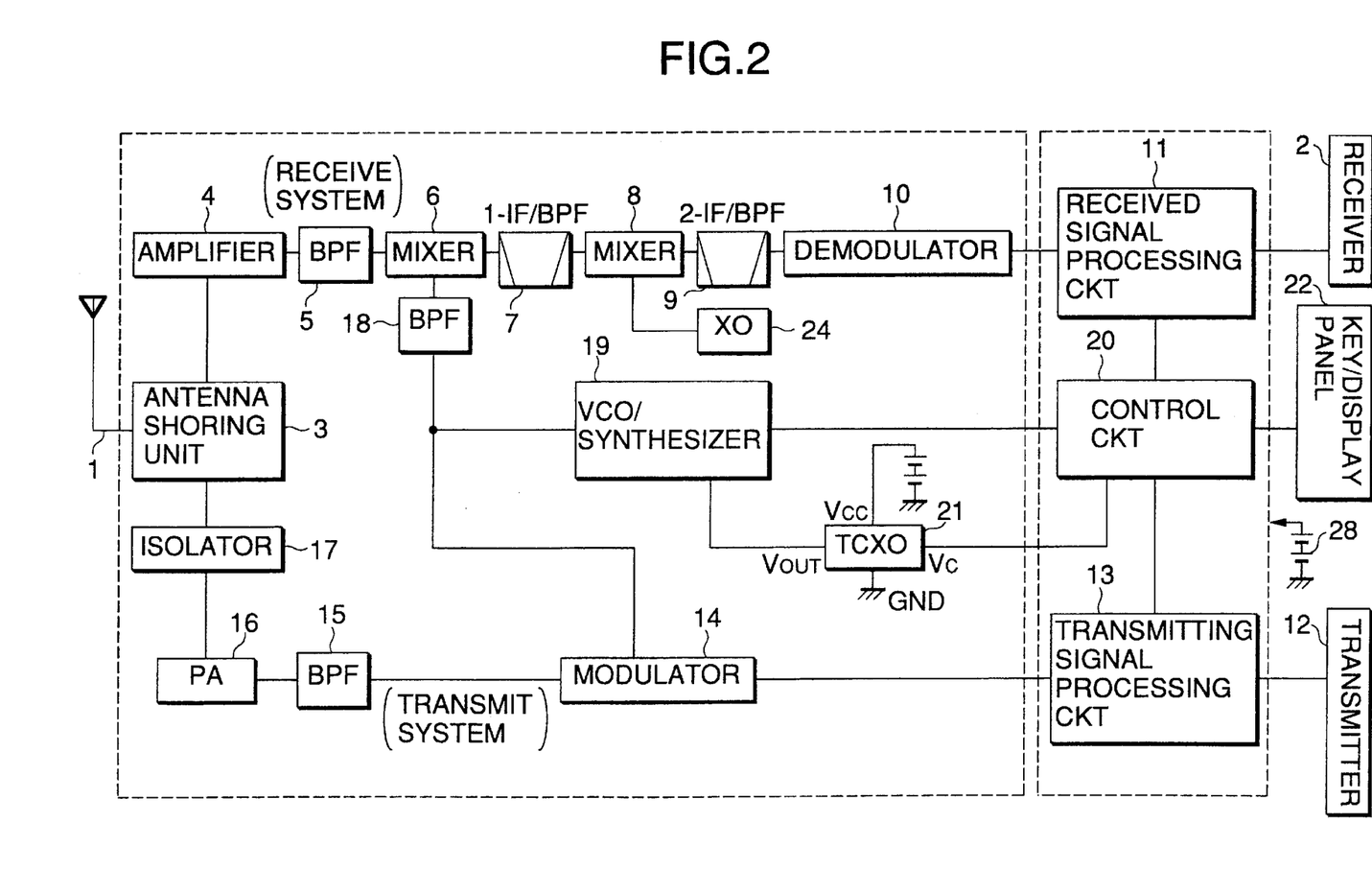
FIG. 2 is a block diagram of a portable telephone in which the crystal oscillating device of FIG. 1 is used.

FIG. 2 is a block diagram of a portable telephone. In FIG. 2, reference numeral 1 denotes an antenna. Arranged between the antenna 1 and a receiver 2 are the following components from the antenna 1 side: an antenna sharing unit 3, an amplifier 4, a bandpass filter 5, a mixer 6, a bandpass filter 7, a mixer 8, a bandpass filter 9, a demodulator 10, and a received signal processing circuit 11. Further, arranged between the antenna sharing unit 3 and a transmitter 12 are the following components from the transmitter 12 side: a transmitting signal processing circuit 13, a modulator 14, a bandpass filter 15, a power amplifying section 16, and an isolator 17. Further, the mixer 6 is connected to a VCO/synthesizer 19 through a bandpass filter 18. The VCO/synthesizer is connected also to the modulator 14. A closed circuit formed of a control circuit 20 and a temperature-compensated crystal oscillator (hereinafter referred to as "TCXO") 21 is connected to the VCO/synthesizer 19. Further, the received and the transmitting signal processing circuits 11, 13 and a key/display panel 22 are connected to the control circuit 20. It may be noted that a crystal oscillating element 24 is connected to the mixer 8.

Figure 1:
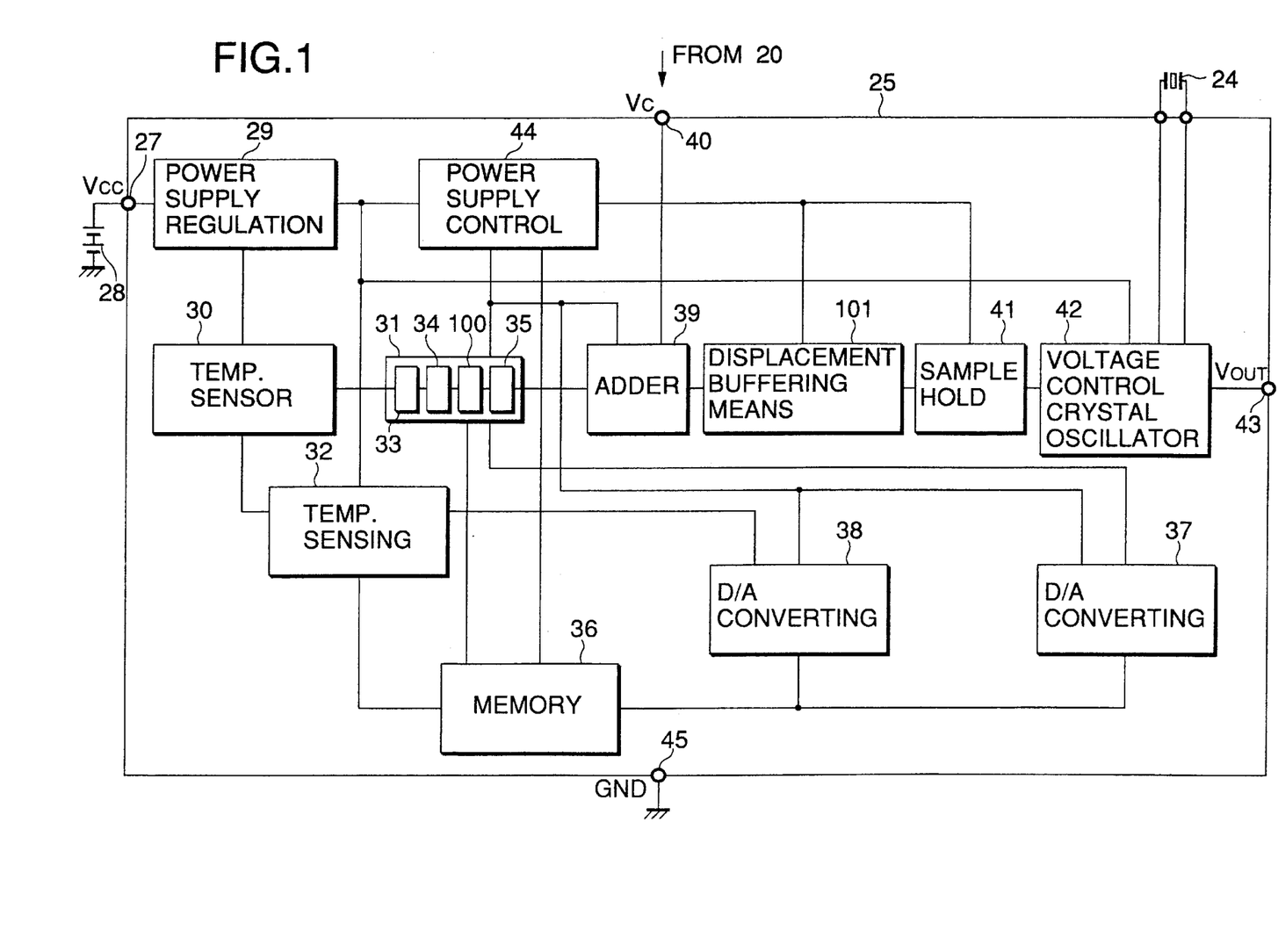
FIG. 1 is a block diagram of a crystal oscillating device, which is a mode for carrying out the invention.
Figure 3:
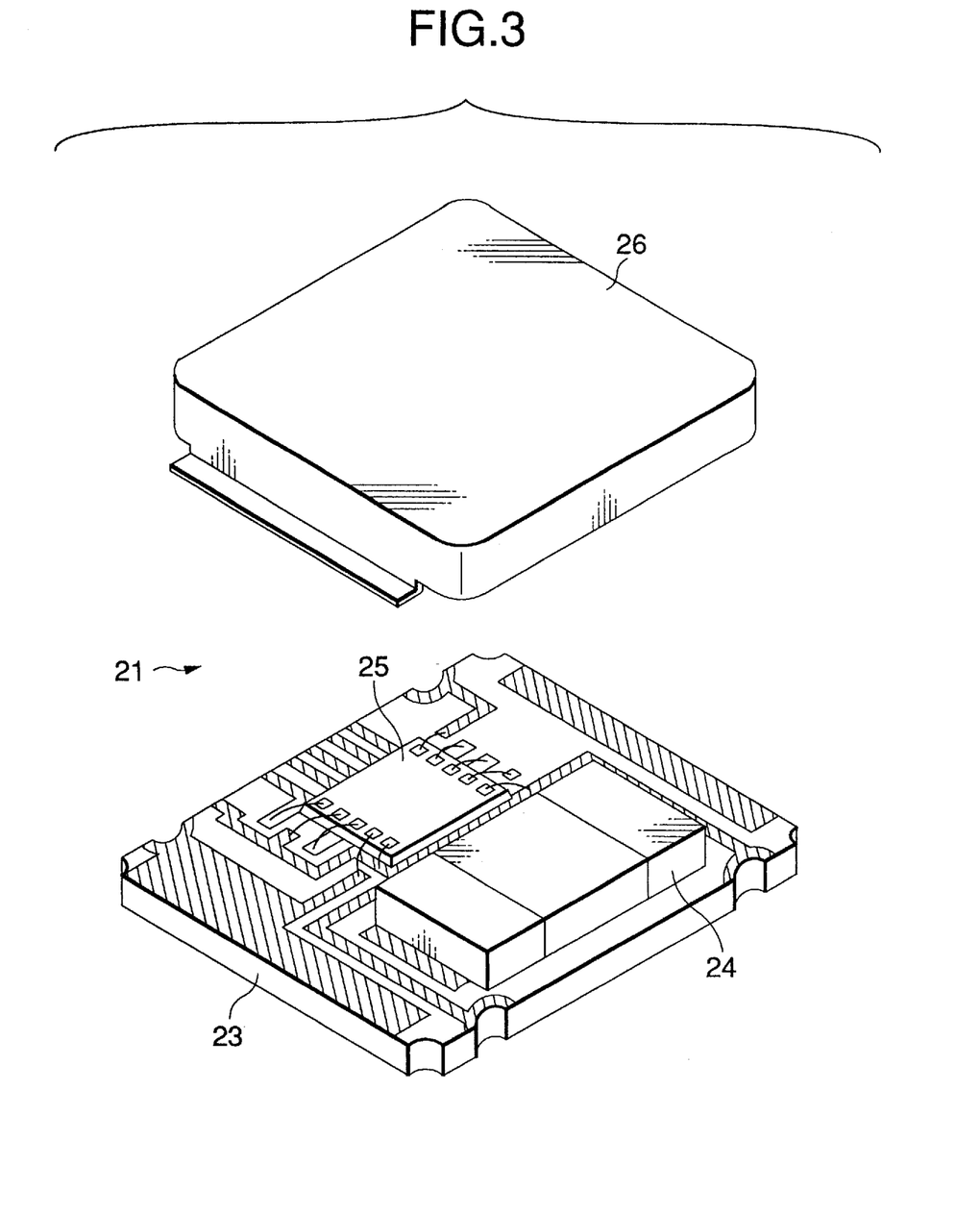
FIG. 3 is an exploded perspective view of TCXO used in the crystal oscillating device of FIG. 1.

That is, a signal produced at TCXO 21 is multiplied, and the multiplied signal is outputted to the receiver-side mixer 6 through the bandpass filter 18 or to the transmitter-side modulator 14. This block diagram is well known. Now, the construction of TCXO 21 in this mode for carrying out the invention is shown in FIGS. 1 and 3. In FIG. 3, reference numeral 23 denotes a board. The crystal oscillating element 24 and a semiconductor integrated circuit (hereinafter referred to as "IC") 25 are mounted on the board 23. These components 24, 25 are sealed and held in the mounted condition by a case 26 that is made of metal and that closes the board 23. As shown in FIG. 1, a battery 28 of the portable telephone shown in FIG. 2 is connected to a Vcc terminal 27 of IC 25. A power supply regulator 29 is connected to the Vcc terminal 27, the power supply regulator 29 serving to stabilize power supply.

The power supply regulator 29 supplies power stably to various parts shown in FIG. 1. Now, a temperature sensor 30 arranged within IC 25 is connected to an amplifying section 31 and a temperature sensing section 32, so that a detected temperature signal can be supplied to these sections 31, 32.

It may be noted that the temperature sensor 30 is constructed of a semiconductor diode. The temperature sensor 30 gradually decreases resistance thereof linearly with increasing temperature, so that output voltage therefrom also decreases so as to depict a continuous downward straight line.

The amplifying section 31 includes: a polarity inverting circuit 33 connected to the temperature sensor 30; and a variable attenuator 34, an offset adjusting circuit 100, and an amplifying circuit 35 that are sequentially connected in the succeeding stage of the polarity inverting circuit 33. Further, the polarity inverting circuit 33, the offset adjusting circuit 100, and a memory 36 are connected to the variable attenuator 34. Further, a second D/A converting section 37 is connected to the offset adjusting circuit 100.

Moreover, the memory 36, the offset adjusting circuit 100, and the second D/A converting section 37 are connected to the amplifying circuit 35. Further, a first D/A converting section 38 is interposed between the memory 36 and the temperature sensing section 32.

Further, an adder 39 is connected to the amplifying circuit 35 of the amplifying section 31. The control circuit 20 of the portable telephone shown in FIG. 2 is connected to the adder 39 through a Vc terminal 40.

Further, the output of the adder 39 is connected to a sample hold circuit 41 through a displacement buffering means 101. The output of the sample hold circuit 41 is supplied to a voltage controlled crystal oscillator 42. The output of the voltage controlled crystal oscillator 42 is supplied to the VCO/synthesizer 19 shown in FIG. 2 through a Vout terminal 43.

It may be noted that reference numeral 44 denotes a power supply control section for operating TCXO 21 intermittently as will be described later, and reference numeral 45 denotes a GND terminal in FIG. 1.

While the operation of TCXO 21 shown in FIG. 1 will be described in detail later, the general operation thereof will now be described to facilitate the understanding.

That is, a maximum of 8 control voltage setting groups, each control voltage setting group consisting of temperature detection data, gain setting data, and offset voltage data, is stored in the memory 36.

Therefore, when a temperature detected by the temperature sensor 30 has been transmitted to the temperature sensing section 32 as a first signal, temperature detection data within the 8 control voltage setting groups stored in the memory 36 are sequentially supplied to the temperature sensing section 32 through the first D/A converting section 38 as second signals, and the first signal is compared with the second signals at the temperature sensing section 32.

Which control voltage setting group out of the 8 control voltage setting groups within the memory 36 should supply the gain setting data and the offset voltage data to the amplifying section 31 and to the second D/A converting section 37 is determined based on the comparison, and the determined control voltage setting group then supplies the gain setting data and offset voltage data thereof to the sections 31, 37.

As a result of this operation, the operation of restricting oscillation frequency variations associated with temperature variations is performed, which will be described in detail later.

Then, the construction of the voltage controlled crystal oscillator 42 shown in FIG. 1 will be described with reference to FIG. 4.

In the voltage controlled crystal oscillator 42, a stable dc current is supplied to amplifying circuits 46, 47 from the power supply regulator 29 of FIG. 1.

As known well, an oscillating circuit is formed of the amplifying circuit 46 and a resistor 48 connected in parallel to the amplifying circuit 46. The crystal oscillating element 24 is caused to oscillate by this oscillating circuit.

The oscillation output of the crystal oscillating element 24 is outputted to the VCO/synthesizer 19 of FIG. 2 through the amplifying circuit 47 and a Vout terminal 43.

Figure 4:
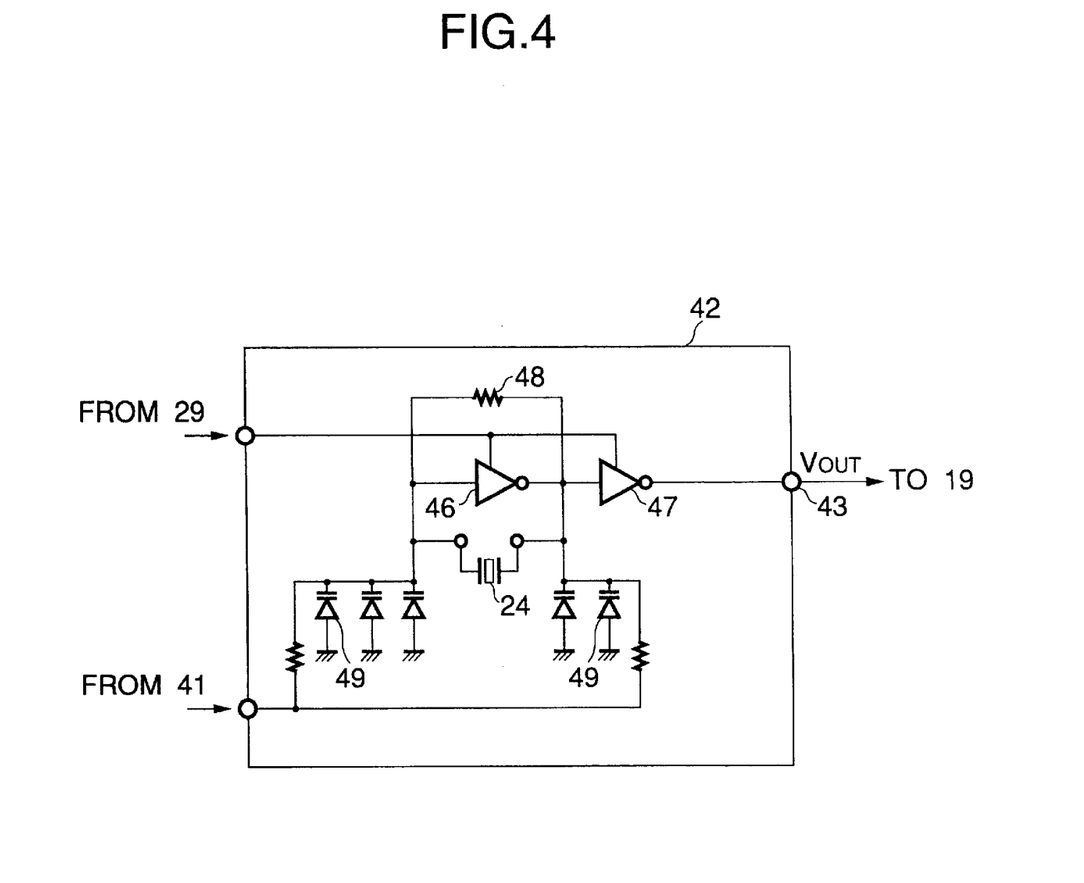
FIG. 4 is a block diagram of a voltage controlled crystal oscillator used in the crystal oscillating device of FIG. 1.

Now, it is a plurality of varactor diodes 49 that adjust oscillation frequency in FIG. 4. The plurality of varactor diodes 49 are arranged as frequency adjusting elements on both input and output sides of the crystal oscillating element 24. That is, the capacitance of each varactor diode 49 is adjusted in accordance with the dc voltage level that is applied to the cathode of the varactor diode 49 through the sample hold circuit 41 of FIG. 1. As a result of the varactor diode capacitance adjustment, oscillation frequencies can be adjusted.

It may be noted that the total capacitance of the plurality of varactor diodes 49 arranged on the input side of the crystal oscillating element 24 is set to a value equal to or greater than the total capacitance of the varactor diodes 49 arranged on the output side. The reason therefor is to save power consumption. If a large capacitance is set on the output side, a large current tends to flow, so that power consumption is disadvantageously increased.

Figure 5:
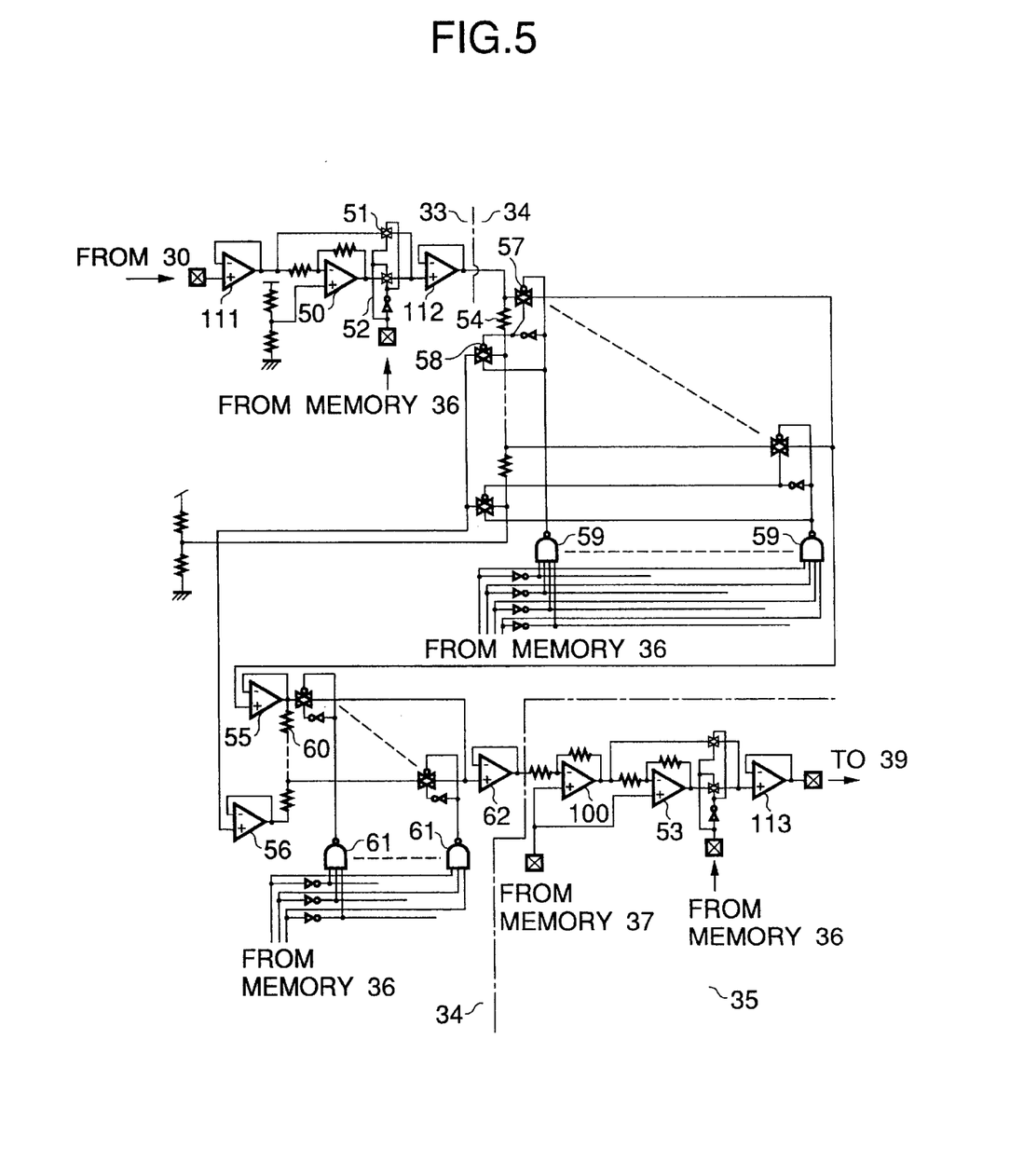
FIG. 5 is a circuit diagram of an amplifying section used in the crystal oscillating device of FIG. 1.

Now, the amplifying section 31 will be described by returning to FIG. 1. As has been described above, the amplifying section 31 is constructed of a series circuit that includes the polarity inverting circuit 33, the variable attenuator 34, the offset adjusting circuit 100, and the amplifying circuit 35. Details of the construction of the amplifying section 31 is shown in FIG. 5.

That is, the polarity inverting circuit 33 includes: an amplifying circuit 50, a buffering amplifying circuit 111 between the amplifying circuit 50 and the temperature sensor 30, two switching elements 51, 52, and a buffering amplifying circuit 112. Out of these components, each of the switching elements 51, 52 performs opposite switching operation. Further, the amplifying circuit 50 has a gain of 1. In addition, the output of the temperature sensor 30 through the amplifying circuit 111 is inputted to the inverting input terminal of the amplifying circuit 50.

When the switching elements 51, 52 are turned on and off is determined by digital data from the memory 36.

That is, when the switching element 51 is turned on and the switching element 52 is turned off by the digital data from the memory 36, the output from the temperature sensor 30 is delivered to the variable attenuator 34 directly via the switching element 51 while bypassing the amplifying circuit 50 and through the amplifying circuit 112.

On the other hand, when the switching element 51 is turned off and the switching element 52 is turned on, the output from the temperature sensor 30 is inverted at the amplifying circuit 50 and delivered to the variable attenuator 34 through the amplifying circuit 112.

The variable attenuator 34 that has received the output from the thus constructed polarity inverting circuit 33 is designed to generate a tentative gradient by taking into consideration a gradient to be given as a result of the output having finally been amplified by the amplifying circuit 35.

That is, the variable attenuator 34 has 16 series-connected resistors and a plurality of switching elements 57, 58. The switching elements 57, 58, which are paired to form a single set, allow a voltage at the ends of a selected resistor or resistors 54 to be introduced to amplifying circuits 55, 56.

The selected switching elements 57, 58 are designed to turn on simultaneously.

The switching elements 57, 58, which are paired to form a single set, are selected based on which one of a plurality of NAND elements 59 has been selected by digital data from the memory 36.

One of the voltages at the ends of resistors 54 selected by the selected switching elements 57, 58 having been turned on is applied to the amplifying circuit 55 and the other voltage to the amplifying circuit 56.

Sixteen series-connected resistors 60 are inserted between the outputs of the amplifying circuits 55, 56. Which resistor or resistors 60 should be selected is determined by digital data from the memory 36 based on which one of a plurality of NAND elements 61 has been selected. The voltage at both ends of the selected resistor or resistors 60 is applied to an amplifying circuit 62.

That is, primary voltage selection is made at the upper portion of FIG. 5 of the variable attenuator 34. For example, $8/16*V$ and $7/16*V$ are selected. Then, secondary voltage selection is made at the lower portion of FIG. 5. That is, which voltage between $8/16*V$ and $7/16*V$ is finally selected is determined by making a selection from the 16 resistors 60.

If $7.5/16*V$ has been selected, for example, such selected voltage is supplied to the offset adjusting circuit 100 through the amplifying circuit 62. After having been subjected to an offset adjusting process at the offset adjusting circuit 100, the thus offset-adjusted voltage is supplied to an amplifying circuit 53.

The offset operation in the offset adjusting circuit 100 will now be described first.

The voltage from the amplifying circuit 62 is supplied to the inverting input terminal of the offset adjusting circuit 100 that is constructed of an amplifying circuit whose gain is −1. On the other hand, the offset voltage from the second D/A converting section 37 is supplied to the noninverting input terminal of the offset adjusting circuit 100. With the offset voltage supplied, an offset adjustment is made. It may be noted that the offset voltage is obtained by supplying the offset voltage data belonging to a selected control voltage setting group within the memory 36 to the second D/A converting section 37. That is, if the offset voltage is 1.5 V, for example, the following offset adjustment will be made.

That is, assuming that the inverting input is Vin and the noninverting input is VREF in the offset adjusting circuit 100, an output Vout can be expressed as follows.

$$Vout = (Vin - VREF) * -1 + VREF$$

Therefore, the result obtained by substituting the aforementioned value $7.5/16*V$ for Vin and the aforementioned value 1.5 V for VREF is equal to Vout.

The thus offset-adjusted offset voltage (Vout) is supplied to the inverting input terminal of the amplifying circuit 53.

The amplifying circuit 53 has, e.g., a fixed gain of 8. Since the amplifying circuit 53 receives the output from the offset adjusting circuit 100 at the inverting input terminal thereof, the amplifying circuit 53 gives an output voltage that is −8 times the input voltage. Thus, it is the gradient of the voltage whose polarity has been set at the polarity inverting circuit 33 that is set by the amplifying circuit 53.

Further, an analog voltage is also supplied to the noninverting input terminal of the amplifying circuit 53 from the second D/A converting section 37. The reason therefor is to prevent offset errors from occurring when a voltage that has been subjected to an offset adjusting process at the offset adjusting circuit 100 is amplified at a gain of 8 by the amplifying circuit 53. Offset errors can be prevented by making the reference voltage of the amplifying circuit 53 identically equal to that of the offset adjusting circuit 100.

Figure 6:
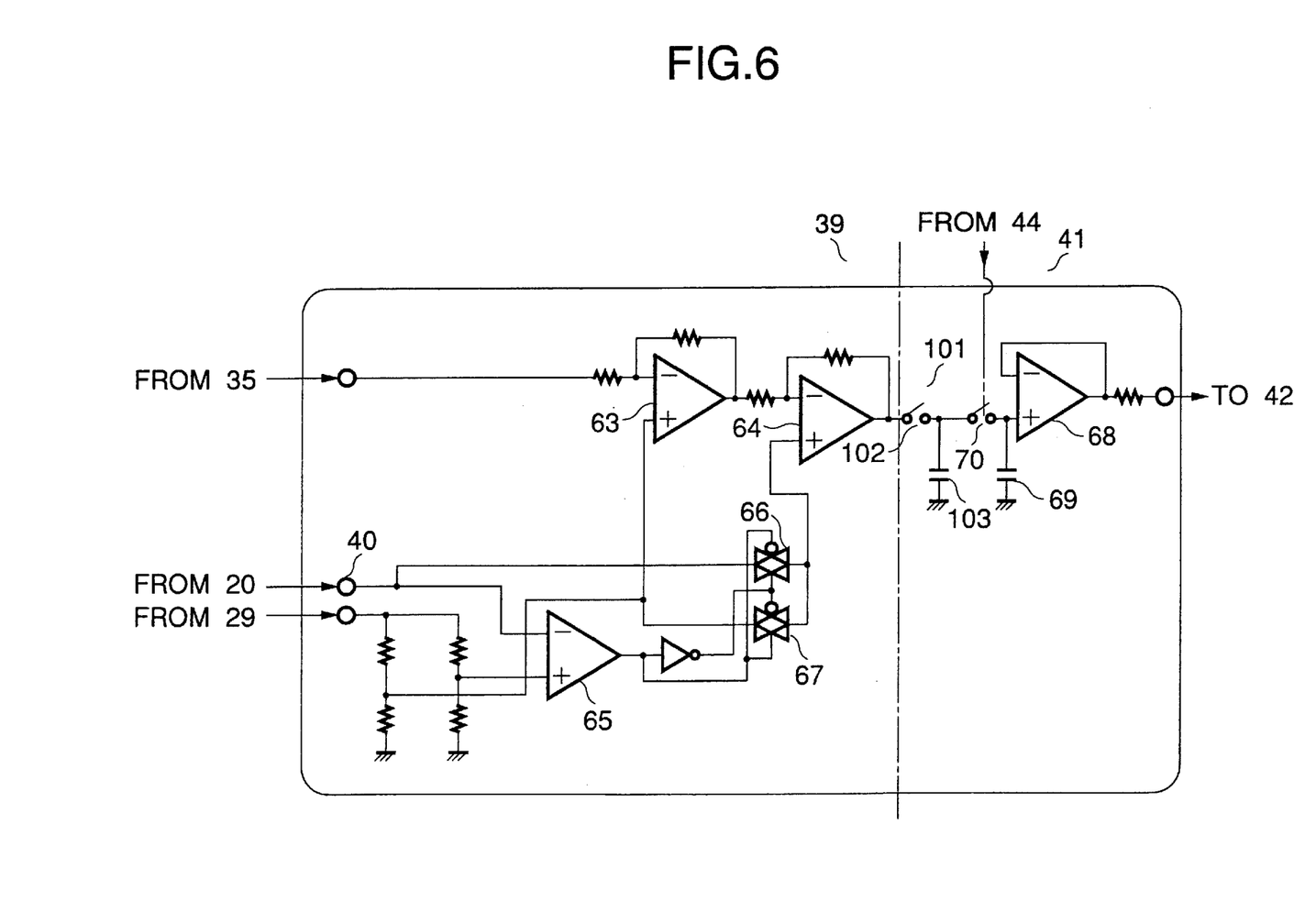
FIG. 6 is a circuit diagram showing an adder, a displacement buffering means, and a sample hold circuit used in the crystal oscillating device of FIG. 1.

The voltage whose polarity, gradient, and offset have been set and adjusted in this way is outputted to the adder 39 through a buffering amplifying circuit 113. The construction of the adder 39 is as shown in FIG. 6.

That is, the output from the amplifying section 31 of FIG. 5 is designed to be supplied to the inverting input terminals of amplifying circuits 63, 64 whose gain is 1, and if oscillation frequencies are shifted due to secular change or the like, a dc voltage is supplied to the Vc terminal 40 from the control circuit 20 of the portable telephone shown in FIG. 2.

The dc voltage supplied to the Vc terminal 40 is higher than a predetermined value when the oscillation frequency is shifted toward the lower side, while the dc voltage is lower than the predetermined value when the oscillation frequency is shifted toward the higher side.

A comparator 65 monitors the dc voltage supplied from the control circuit 20, whether the dc voltage is lower or higher than the predetermined value. When the dc voltage is supplied to the inverting input terminal of the comparator 65, the comparator 65 is turned off. As a result, a switching element 66 turns on and a switching element 67 turns off, which in turn causes the dc voltage, which is either lower or higher than the predetermined value and which has been supplied to the Vc terminal 40, to be supplied to the noninverting input terminal of the amplifying circuit 64. If a low dc voltage is supplied to the noninverting input terminal, the voltage to be supplied to the cathodes of the varactor diodes 49 shown in FIG. 4 is decreased, which in turn increases the capacitances of the varactor diodes 49 and decreases the oscillation frequency.

On the other hand, if the dc voltage supplied to the Vc terminal 40 is high, the capacitances of the varactor diodes 49 are decreased for the aforementioned reason, so that the oscillation frequency is increased. That is, the adder 39 prevents the shifting of oscillation frequencies due to secular change or the like in this way.

Then, the output from the adder 39 is supplied to the displacement buffering means 101 as shown in FIG. 6.

The displacement buffering means 101 includes a first switching element 102, and a second capacitor 103 that is connected to the switching element 102. The output of the displacement buffering means 101 is supplied to the sample hold circuit 41. The sample hold circuit 41 includes an amplifying circuit 68, a second capacitor 69 that is connected to the noninverting input terminal of the amplifying circuit 68, and a second switching element 70 that is disposed on the input side of the amplifying circuit 68.

Figure 7:
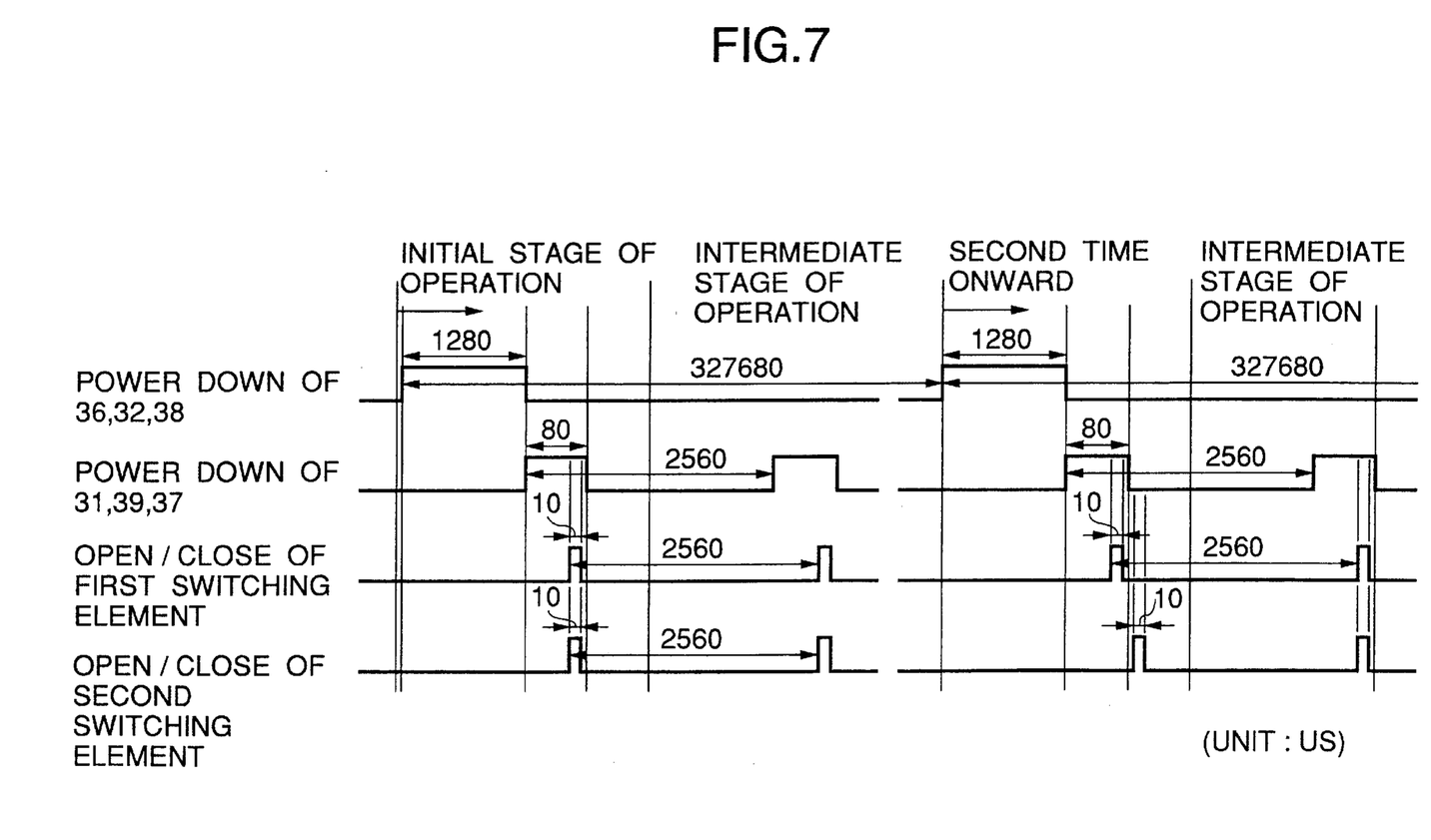
FIG. 7 is a time chart showing operating conditions of a main portion of the crystal oscillating device of FIG. 1.

The first and the second switching elements 102, 70 are caused to repeat switching operations intermittently by the power supply control section 44 shown in FIG. 1. As shown in FIG. 7, at an initial stage of operation in which the power supply voltage is supplied at the Vcc terminal 27, the first switching element 102 and the second switching element 70 perform the same switching operations, and the first and the second capacitors 103, 69 are quickly charged to a control voltage level specified by various conditions up to that moment, and the control voltage to be supplied to the cathodes of the varactor diodes 49 is determined by such charged control voltage level.

However, after the first and the second switching elements 102, 70 have been opened, the first and the second capacitors 103, 69 self-discharge to decrease the charged voltage.

Therefore, the first and the second switching elements 102, 70 are closed again to thereby charge the capacitors 103, 69.

While the first switching element 102 is being opened, power supply is stopped to the entire part of the amplifying section 31, the adder 39, and the second D/A converting section 37 based on an instruction from the power supply control section 44. Energy saving is thus implemented.

It may be noted that the reliable charging of the first and the second capacitors 103, 69 is implemented by performing without failure the power supply stop operation after the sample hold circuit 41 has been open-circuited as shown in FIG. 7.

Further, while the memory 36 is repetitively executing a predetermined routine, energy saving is implemented by causing the power supply control section 44 to provide conduction to the memory 36, the temperature sensing section 32, and the first D/A converting section 38 intermittently.

Here, when the memory 36 is provided with a second conduction and onward, the first switching element 102 and the second switching element 70 perform the switching operations at the same cycle as shown in FIG. 7. When the first switching element 102 is opened, the second switching element 70 is closed, so that it is only the first capacitor 103 that is charged, whereas when the second switching element 70 is opened, the first switching element 102 is closed, so that the second capacitor 69 is charged through the first capacitor 103.

Figure 8:
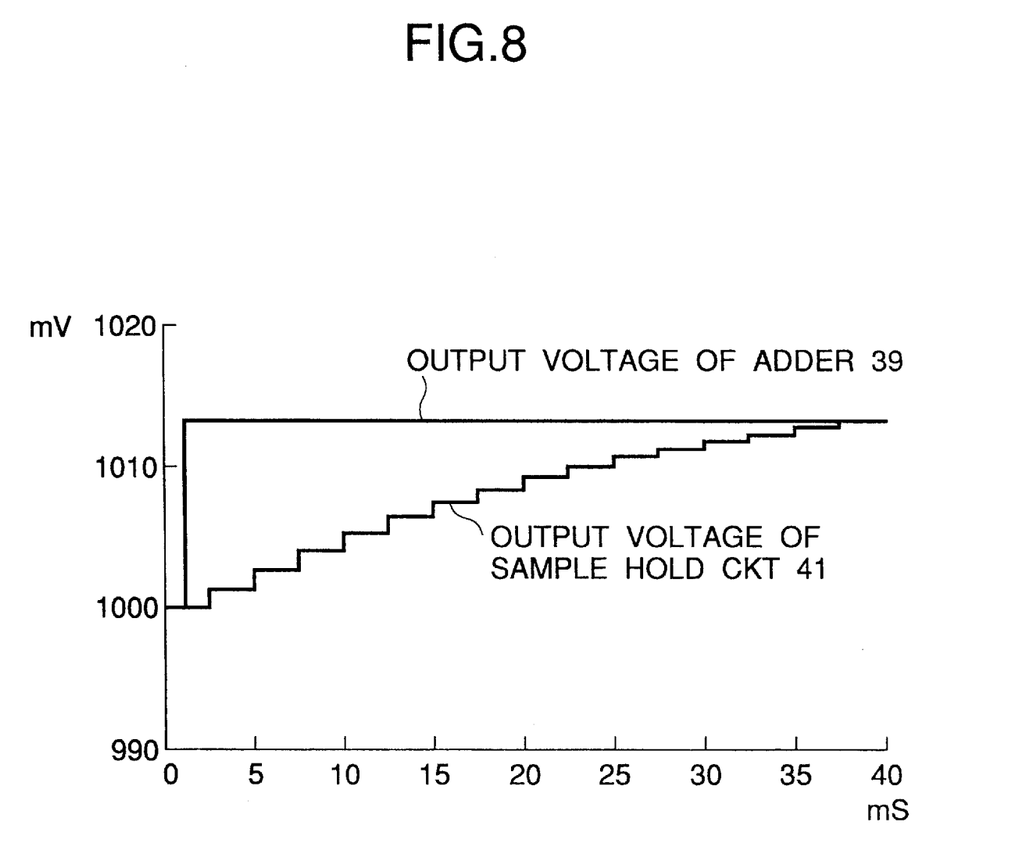
FIG. 8 is a diagram showing an input voltage of the displacement buffering means and an output voltage of the sample hold circuit of FIG. 6.

On the other hand, when the gain setting data and the offset voltage data are altered after the operation of the memory 36, the output voltage of the adder 39 is abruptly changed due to quantum errors of the variable attenuator and the offset adjusting circuit as shown in FIG. 8. However, as a result of the aforementioned operation, the control voltage to be applied to the cathodes of the varactor diodes 49 is set to a predetermined control voltage through gradual change.

While the two switches are used in constituting the displacement buffering means in this mode for carrying out the invention, the switch on the preceding stage may be constructed of a resistor.

The memory 36 is formed of an EEPROM, so that data can be rewritable.

Figure 9:
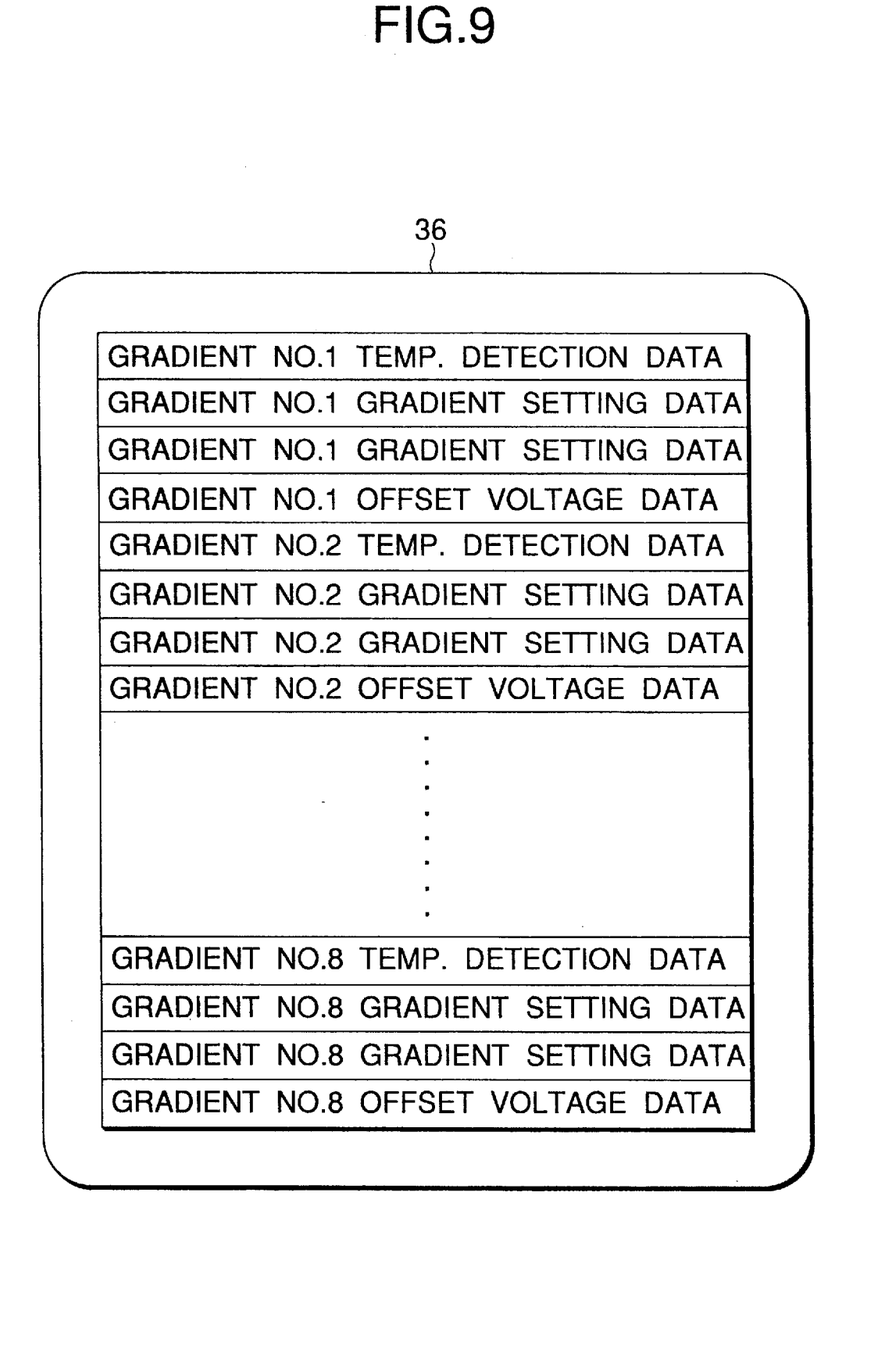
FIG. 9 is a diagram showing a memory map of a memory used in the crystal oscillating device of FIG. 1.

Specifically, the memory 36 has 8 control voltage setting groups, each group consisting of 4 bytes, as shown in FIG. 9.

The first byte of each control voltage setting group stores temperature detection data; the second byte, gradient setting data; the third byte, gradient setting data; and the fourth byte, offset voltage data.

Further, the first control voltage setting group forms a first linear control voltage (having polarity, gradient, and offset voltage) for a low to a high temperature; the second control voltage setting group forms a second linear control voltage for higher temperatures than the first control voltage setting group; the third control voltage setting group forms a third linear control voltage for still higher temperatures than the second control voltage setting group; the fourth control voltage setting group forms a fourth linear control voltage for still higher temperatures than the third control voltage setting group; the fifth control voltage setting group forms a fifth linear control voltage for still higher temperatures than the fourth control voltage setting group; the sixth control voltage setting group forms a sixth linear control voltage for still higher temperatures than the fifth control voltage setting group; the seventh control voltage setting group forms a seventh linear control voltage for still higher temperatures than the sixth control voltage setting group; and the eighth control voltage setting group forms an eighth linear control voltage for still higher temperatures than the seventh control voltage setting group. The control voltage setting groups are designed so that, depending on the characteristics of the crystal oscillating element 24, a satisfactory temperature compensation from low to high temperatures can be made without involving control voltage setting groups up to the eighth control voltage setting group.

That is, the most significant feature of this mode for carrying out the invention is to make temperature compensations between a low to a high temperature through linear approximation using 8 linear control voltages at the most.

That is, in this mode for carrying out the invention, the operation starts with, first placing the case 26 shown in FIG. 3 on the board 23, then putting the board 23, which has been covered by the case 26 with IC 25 and the crystal oscillating element 24 hermetically sealed therein, in a constant temperature vessel, and then writing data into the memory 36. For this initial part of operation, the switching element 70 in FIG. 6 is kept opened.

The temperature of the constant temperature vessel is gradually increased from −30° to 80° C., and a dc voltage is applied to the varactor diodes 49 through the capacitor 69 and the amplifying circuit 68 of FIG. 6 in 10° C. increments between these temperatures.

Figure 10:
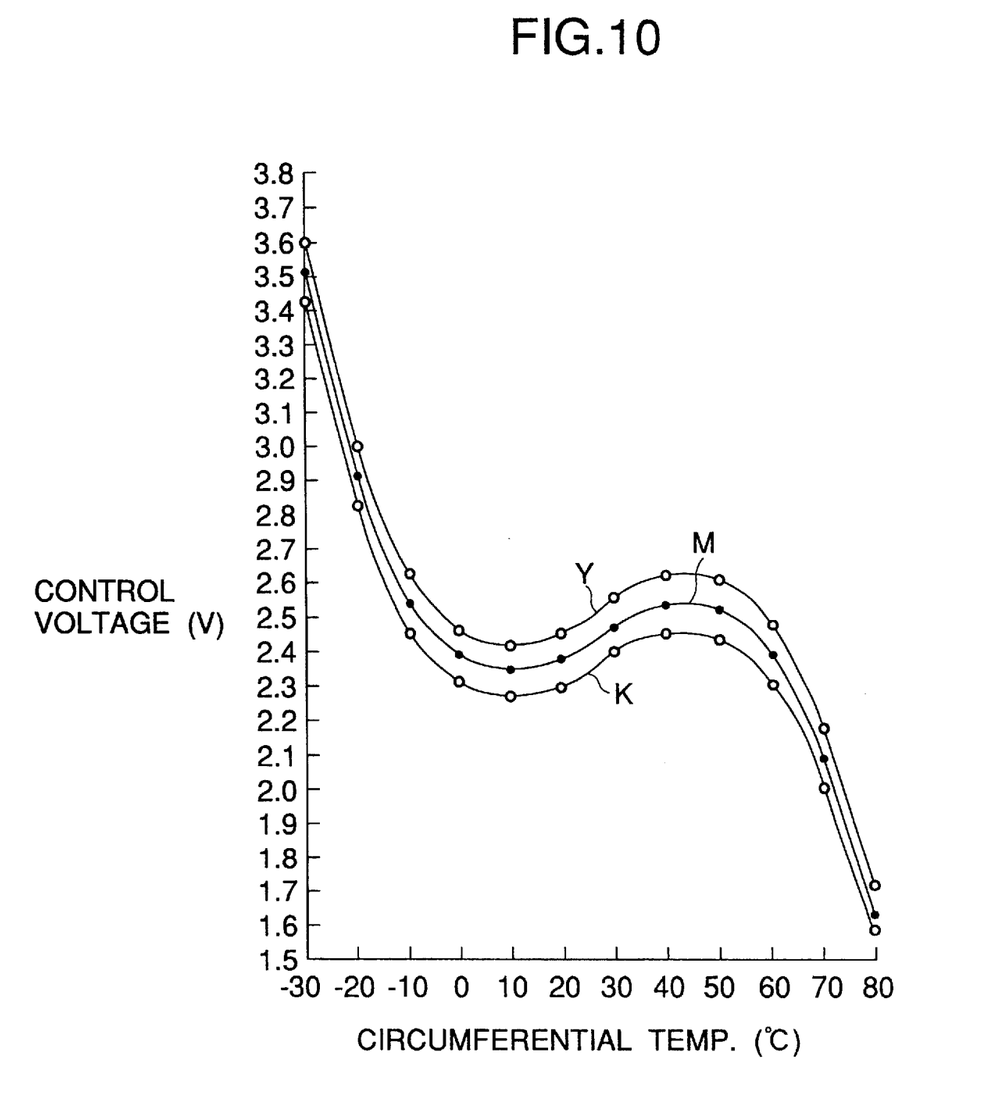
FIG. 10 is a diagram showing a control voltage to be applied to varactor diodes of the voltage controlled crystal oscillator used in the crystal oscillating device of FIG. 1.

Then, control voltages, which allow the oscillation frequency of the voltage controlled crystal oscillator 42 to take a fixed value that is equal to, e.g., a reference frequency of 12.8 MHz, are plotted in 10° C. increments, and the plotted values are connected to obtain a line M in FIG. 10.

Then, control voltages, which allow the oscillation frequency of the voltage controlled crystal oscillator 42 to take a value that is equal to a reference frequency of 12.8 MHz plus 1 ppm, are similarly plotted in 10° C. increments, and the plotted values are connected to obtain a line Y.

Then, control voltages, which allow the oscillation frequency of the voltage controlled crystal oscillator 42 to take a value that is equal to a reference frequency of 12.8 MHz minus 1 ppm, are similarly plotted in 10° C. increments, and the plotted values are connected to obtain a line K.

Five lines of linear control voltages (line T) are obtained by connecting control voltages plotted on the line M from −30° to 80° C. in such a manner that the five lines of linear control voltages can stay within the control voltage range defined by the lines Y and K.

Observing the linear control voltage line T, the first linear control voltage segment ranges from 3.45 to 2.54 V covering temperatures from −30° to −12° C.

The second linear control voltage segment ranges from 2.54 to 2.33 V covering temperatures from −12° to +9° C.

The third linear control voltage segment ranges from 2.33 to 2.55 V covering temperatures from 9° to 43° C.

The fourth linear control voltage segment ranges from 2.55 to 2.35 V covering temperatures from 43° to 63° C.

The fifth linear control voltage segment ranges from 2.35 to 1.65 V covering temperatures from 63° to 80° C.

Data about each line of these 5 linear control voltages is stored to the first to the fifth control voltage setting groups of the memory 36 as the temperature detection data, the gradient setting data, and the offset voltage data.

Upon completion of storing the data to the memory 36 in this way, the switching element 70 in FIG. 6 is returned to the steady state, so that the switching element 70 is put under a condition ready to be switching-controlled by the power supply control section 44 as described above.

Figure 11:
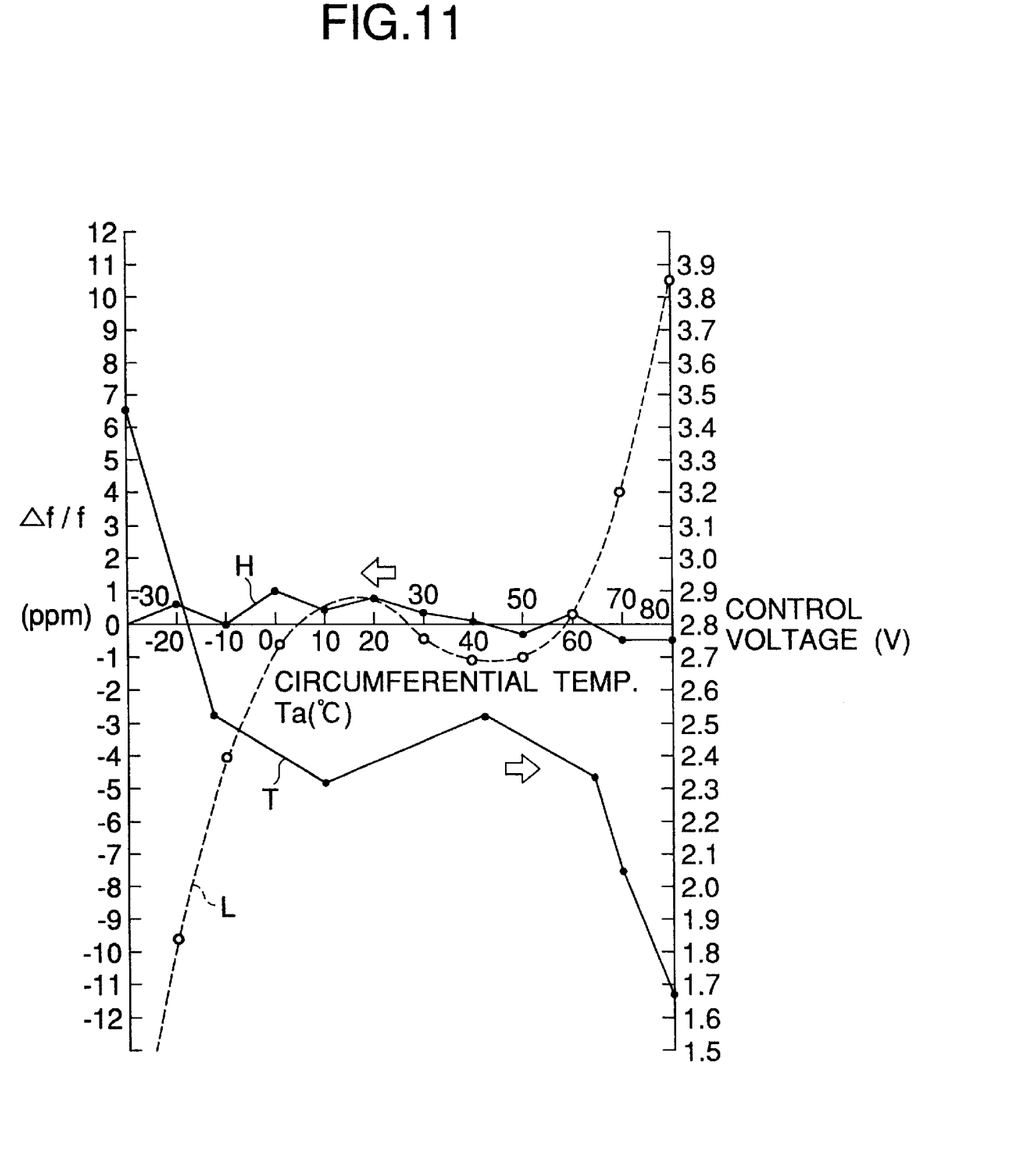
FIG. 11 is a diagram showing a voltage to be applied to the varactor diodes of the voltage controlled crystal oscillator used in the crystal oscillating device of FIG. 1 and oscillation frequencies.

As the temperature of the constant temperature vessel is gradually increased from −30° to 80° C. again under this condition, the control voltages (line T) shown in FIG. 11 are applied to the anodes of the varactor diodes 49 based on the data from the memory 36 in accordance with the minutely changing temperatures. As a result, an extremely highly accurate crystal oscillating device, in which the oscillation frequency of the voltage controlled crystal oscillator 42 is kept within errors of ±1 ppm as indicated by a line H in FIG. 11, has been provided.

A line L shown in FIG. 11 indicates oscillation frequency variations observed when the aforementioned control voltages have not been applied. It can be understood also from a comparison between the line L and the line H according to this mode for carrying out the invention that a linear approximation consisting of 5 linear control voltages could provide an extremely highly accurate oscillation frequency.

It may be noted that the temperature detection data in each control voltage setting group of the memory 36 is converted into a dc voltage by the first D/A converting section 38 of FIG. 1, transmitted to the temperature sensing section 32, and compared with a currently detected temperature from the temperature sensor 30. It may be further noted that the temperature sensor 30, using a semiconductor diode, has an output voltage thereof linearly decreased with increasing temperature.

When it has been found out from the comparison of the temperatures that the voltage from the first D/A converting section 38 is higher, the sequential operation of reading the data from the next control voltage setting group of the memory 36 is performed.

Through repeating such sequential operations, if it has been found out that the dc voltage from the temperature sensor 30 is higher than the dc voltage of the first D/A converting section 38, then the gradient setting data and the offset voltage data belonging to such control voltage setting group of the memory 36 as to correspond to the dc voltage from the temperature sensor 30 are read. Out of the read data, the gradient setting data is supplied to the polarity inverting circuit 33 and the variable attenuator 35 of the amplifying section 31 of FIG. 5 as described above. Further, the offset voltage data is supplied to the, offset adjusting circuit 100 and the amplifying circuit 53 within the amplifying circuit 35 of FIG. 5 through the second D/A converting section 37 as described above.

As described above, the feature of this mode for carrying out the invention is the linear approximation using a maximum of 8 linear control voltages. This feature is a result of the findings that highly accurate oscillation frequency control within ±1 ppm can be implemented with a maximum of 8 linear control voltages, such findings having been obtained through the verification that each voltage controlled crystal oscillator has its own profile of control voltage range shown in FIG. 9.

The aforementioned findings have allowed the inventors to reduce the number of working control voltage setting groups in the memory to 8. Such reduction in the number of working control voltage setting groups has provided a wider range of advantages including a large-scale reduction in memory size, the downsizing and simplifying of the control circuit through the reduction in memory size, and energy saving.

As was described in the foregoing, the invention is characterized as including: a crystal oscillator; a frequency adjusting element electrically connected to the crystal oscillator; and a control circuit for controlling a voltage to be applied to the frequency adjusting element, the control circuit including: a temperature sensor; a temperature sensing section electrically connected to the temperature sensor; a memory electrically connected to the temperature sensing section; an amplifying section to which the memory and the temperature sensor are electrically connected; a first D/A converting section electrically interposed between the memory and the temperature sensing section; and a second D/A converting section electrically interposed between the memory and the amplifying section, the amplifying section including: a polarity inverting circuit connected to the temperature sensor; and a variable attenuator, an offset adjusting circuit, and an amplifying circuit connected sequentially to the polarity inverting circuit, the memory having a plurality of working control voltage setting groups, the plurality being 8 or less, each control voltage setting group having temperature detection data, gain setting data, and offset voltage data stored therein.

As a result of the aforementioned construction, the memory has 8 or less working control voltage setting groups, each group consisting of temperature detection data, gain setting data, and offset voltage data. Therefore, the capacity of the memory is small. In addition, the control circuit dedicated to the memory having 8 or less working control voltage setting groups is simply constructed, and therefore can be downsized easily. As a result of all these advantages, the semiconductor integrated circuit having the memory and the control circuit can be downsized more easily.

Further, using such small-capacity memory and simply constructed control circuit, the power consumed thereby can be decreased more easily. Still further, the amplifying section performs the steps of setting the polarity of a voltage at the polarity inverting circuit; subjecting the control voltage whose gradient has been set by the variable attenuator to an offset adjusting process by the offset adjusting circuit; amplifying the offset-adjusted control voltage by the amplifying circuit; and thereafter applying the amplified control voltage to the frequency adjusting element. Therefore, high frequency adjusting accuracy can be assured.

Still further, when gain setting data and offset voltage data have been changed, an abrupt change occurs in a control voltage. In such a case, the displacement buffering means gradually changes the voltage, so that high operation stability can be assured.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A crystal scillating device, comprising:
   a crystal oscillator;
   a frequency adjusting element electrically connected to said crystal oscillator; and
   a control circuit for controlling a voltage to be applied to said frequency adjusting element;
   wherein said control circuit comprises:
      a temperature sensor;
      a temperature sensing section electrically connected to said temperature sensor;
      a memory electrically connected to said temperature sensing section;
      an amplifying section to which said memory and said temperature sensor are electrically connected;
      a first D/A converting section electrically interposed between said memory and said temperature sensing section; and
      a second D/A converting section electrically interposed between said memory and said amplifying section;
   wherein said amplifying section comprises:
      a polarity inverting circuit connected to said temperature sensor;
      a variable attenuator;
      an offset adjusting circuit; and
      an amplifying circuit, said variable attenuator, said offset adjusting circuit and said amplifying circuit being connected sequentially to said polarity inverting circuit;
   wherein said memory has a plurality of working control voltage setting groups, the plurality being 8 or less, each control voltage setting group having temperature detection data, gain setting data, and offset voltage data stored therein;
   wherein said frequency adjusting element and said amplifying section interposing a sample hold circuit therebetween; and
   wherein said sample hold circuit and said amplifying section interposing a displacement buffering means therebetween.

2. A crystal oscillating device according to claim 1, wherein said displacement buffering means is designed so that a control voltage of one control voltage setting group is connected to a control voltage of another control voltage setting group smoothly.

3. A crystal oscillating device according to claim 1, wherein said displacement buffering means is constructed of a plurality of series-connected switches and a plurality of capacitors.

4. A crystal oscillating device according to claim 2, wherein the plurality of switches are selectively closed.

5. A crystal oscillating device according to claim 3, wherein said plurality of switches are closed at an identical cycle.

6. A crystal oscillating device according to of claim 3, wherein said plurality of switches are simultaneously closed in an initial stage of operation.

7. A crystal oscillating device according to claim 3, wherein said plurality of switches are simultaneously closed in an intermediate stage of operation.

8. A crystal oscillating device according to claim 3, wherein a capacitance of a capacitor in a preceding stage is smaller than a capacitance of a capacitor in a succeeding stage in said plurality of capacitors.

9. A crystal oscillating device according to claim 1, wherein said displacement buffering means is constructed of a plurality of series-connected resistors and a plurality of capacitors.

10. A crystal oscillating device according to claim 9, wherein a capacitance of a capacitor in a preceding stage is larger than a capacitance of a capacitor in a succeeding stage in said plurality of capacitors.

11. A crystal oscillating device according to claim 1, wherein at least one of said amplifying section, said first and said second D/A converting sections, said temperature sensing section, and said memory is operated intermittently.

12. A crystal oscillating device according to claim 11, wherein a stop time in said intermittent operation of at least one of said amplifying section, said first and said second D/A converting sections, and said temperature sensing section is shorter than a stop time of said intermittent operation of said memory.

13. A crystal oscillating device according to claim 11, wherein said sample hold circuit is interposed between said frequency adjusting element and said amplifying section.

14. A crystal oscillating device according to claim 1, wherein said amplifying section is constructed of said variable attenuator and said amplifying circuit.

15. A crystal oscillating device according to claim 14, wherein a lower output level of said variable attenuator is set to a value higher than 0.

16. A crystal oscillating device according to claim 1, wherein said first and said second D/A converting sections are constructed of variable attenuators.

17. A crystal oscillating device according to claim 16, wherein a lower output level of said variable attenuator is set to a value higher than 0.

18. A crystal oscillating device according to claim 1, wherein said frequency adjusting element is constructed of a plurality of varactor diodes, and said plurality of varactor diodes are electrically connected to an input side and an output side of said crystal oscillator.

19. A crystal oscillating device according to claim 18, wherein a capacitance of said varactor diodes on said input side is equal to or greater than a capacitance of said varactor diodes on said output side.

20. A crystal oscillating device according to claim 18, wherein a number of varactor diodes electrically connected to said input side and said output side of said crystal oscillator is selected in accordance with an oscillation frequency of said crystal oscillator.

21. A crystal oscillating device according to claim 1, wherein not only a circuit-opening switch is arranged between said amplifying section and said frequency adjusting element, but also an external voltage input terminal is electrically connected between said circuit-opening switch and said frequency adjusting element.

22. A method of adjusting a crystal oscillating device comprising:
a crystal oscillator;
a frequency adjusting element electrically connected to said crystal oscillator; and
a control circuit for controlling a voltage to be applied to said frequency adjusting element,
said control circuit comprising:
a temperature sensor;
a temperature sensing section electrically connected to said temperature sensor;
a memory electrically connected to said temperature sensing section;
an amplifying section to which said memory and said temperature sensor are electrically connected;
a first D/A converting section electrically interposed between said memory and said temperature sensing section;
a second D/A converting section electrically interposed between said memory and said amplifying section;
said amplifying section comprising:
a polarity inverting circuit connected to said temperature sensor; and
a variable attenuator, an offset adjusting circuit, and an amplifying circuit connected sequentially to said polarity inverting circuit,
said memory having a plurality of working control voltage setting groups, the plurality being 8 or less, each control voltage setting group) having temperature detection data, gain setting data, and offset voltage data stored therein,
said frequency adjusting element and said amplifying section interposing a sample hold circuit therebetween,
said sample hold circuit and said amplifying section interposing a displacement buffering means therebetween,
said method comprising the steps of:
placing said crystal oscillating device in a constant temperature vessel with said amplifying section and said displacement buffering means being open-circuited and with said plurality of switches constituting said displacement buffering means being also opened;
varying a temperature of said constant temperature vessel from a low temperature to a high temperature;
detecting such a range defining upper and lower control voltages as to allow an oscillation frequency of said crystal oscillator to be contained within a predetermined error range by applying a control voltage to said frequency adjusting element every predetermined temperature within the varied temperatures;
connecting points from the low temperature to the high temperature with a maximum of 8 lines in such a manner that the maximum of 8 lines can stay within the control voltage range obtained through the detection from the low temperature to the high temperature; and
storing data calculated from each of the maximum of 8 lines and from detected outputs of said temperature sensor from the low temperature to the high temperature in said memory ac temperature detection data, gain setting data, and offset voltage data corresponding to each of the lines.

* * * * *

UNITED STATES PATENT AND TRADEMARK OFFICE
CERTIFICATE OF CORRECTION

PATENT NO. : 5,874,864
DATED : February 23, 1999
INVENTOR(S) : Muto et al.

It is certified that error appears in the above-identified patent and that said Letters Patent is hereby corrected as shown below:

On the Title Page, Item [57], Abstract, delete "31," and insert --31.--.

Column 1, Line 24, "95°" should not be in bold type.

Column 6, Line 24, "16" should not be in bold type.

Column 8, Line 43, "8" should not be in bold type.

Column 10, Line 40, delete "the," and insert --the--.

Column 14, Line 18, Claim 22, delete "group)" and insert --group--.

Column 14, Line 50, Claim 22, delete "ac" and insert --as--.

Signed and Sealed this

Twentieth Day of July, 1999

Attest:

Attesting Officer

Q. TODD DICKINSON

Acting Commissioner of Patents and Trademarks